(12) United States Patent
Ju et al.

(10) Patent No.: US 9,171,717 B2
(45) Date of Patent: Oct. 27, 2015

(54) METHOD FOR MANUFACTURING A GROUP III NITRIDE SUBSTRATE USING A CHEMICAL LIFT-OFF PROCESS

(75) Inventors: Jin Woo Ju, Gwangju (KR); Jong Hyeob Baek, Daejeon (KR); Hyung Jo Park, Gwangju (KR); Sang Hern Lee, Gwangju (KR); Tak Jung, Gwangju (KR); Ja Yeon Kim, Gwangju (KR); Hwa Seop Oh, Gwangju (KR); Tae Hoon Chung, Seoul (KR); Yoon Seok Kim, Gwangju (KR); Dae Woo Jeon, Jeollabuk-do (KR)

(73) Assignee: KOREA PHOTONICS TECHNOLOGY INSTITUTE, Gwangju (KR)

( * ) Notice: Subject to any disclaimer, the term of this patent is extended or adjusted under 35 U.S.C. 154(b) by 0 days.

(21) Appl. No.: 13/877,082

(22) PCT Filed: Nov. 4, 2011

(86) PCT No.: PCT/KR2011/008370
§ 371 (c)(1),
(2), (4) Date: Apr. 9, 2013

(87) PCT Pub. No.: WO2012/064050
PCT Pub. Date: May 18, 2012

(65) Prior Publication Data
US 2013/0193558 A1    Aug. 1, 2013

(30) Foreign Application Priority Data
Nov. 8, 2010    (KR) .......................... 10-2010-0110517

(51) Int. Cl.
*H01L 29/20* (2006.01)
*H01L 21/02* (2006.01)
(Continued)

(52) U.S. Cl.
CPC ...... *H01L 21/02609* (2013.01); *H01L 21/0242* (2013.01); *H01L 21/0243* (2013.01); *H01L 21/0254* (2013.01); *H01L 21/0262* (2013.01); *H01L 21/02381* (2013.01); *H01L 21/02389* (2013.01); *H01L 21/02433* (2013.01); *H01L 21/02458* (2013.01); *H01L 21/02647* (2013.01); *H01L 21/02664* (2013.01); *H01L 29/045* (2013.01); *H01L 33/0079* (2013.01)

(58) Field of Classification Search
USPC ................. 257/76, 615; 438/483; 117/95, 97
See application file for complete search history.

(56) References Cited

U.S. PATENT DOCUMENTS 6,153,010 A * 11/2000 Kiyoku et al. .................. 117/95
6,627,520 B2    9/2003 Kozaki et al.
6,627,974 B2    9/2003 Kozaki et al.
(Continued)

FOREIGN PATENT DOCUMENTS

CN    101866880 A    10/2010
JP    2002-261032 A    9/2002
(Continued)

*Primary Examiner* — Cheung Lee
*Assistant Examiner* — Frederick B Hargrove
(74) *Attorney, Agent, or Firm* — Rabin & Berdo, P.C.

(57) ABSTRACT

The non-polar or semi-polar group III nitride layer disclosed in a specific example of the present invention can be used for substrates for various electronic devices, wherein problems of conventional polar group III nitride substrates are mitigated or solved by using the nitride substrate of the invention, and further the nitride substrate can be manufactured by a chemical lift-off process.

15 Claims, 10 Drawing Sheets

(51) Int. Cl.
*H01L 33/00* (2010.01)
*H01L 29/04* (2006.01)

(56) References Cited

U.S. PATENT DOCUMENTS

| | | | |
|---|---|---|---|
| 6,861,729 B2 | 3/2005 | Kozaki et al. | |
| 7,790,584 B2 | 9/2010 | Paek et al. | |
| 8,154,008 B2 | 4/2012 | Lee et al. | |
| 2001/0053618 A1 | 12/2001 | Kozaki et al. | |
| 2003/0032288 A1 | 2/2003 | Kozaki et al. | |
| 2003/0160232 A1 | 8/2003 | Kozaki et al. | |
| 2003/0183157 A1* | 10/2003 | Usui et al. | 117/84 |
| 2004/0147096 A1* | 7/2004 | Kitaoka et al. | 438/483 |
| 2009/0065762 A1 | 3/2009 | Lee et al. | |
| 2009/0155947 A1* | 6/2009 | Paek et al. | 438/46 |
| 2010/0261300 A1 | 10/2010 | Tu et al. | |

FOREIGN PATENT DOCUMENTS

| | | |
|---|---|---|
| JP | 2008-542183 A | 11/2008 |
| JP | 2010-147164 A | 7/2010 |
| KR | 10-0877774 B1 | 1/2009 |
| KR | 10-2009-0063781 A1 | 6/2009 |
| WO | WO 2010-009325 A2 | 1/2010 |
| WO | WO 2010-100689 A1 | 9/2010 |

* cited by examiner

METHOD FOR MANUFACTURING A GROUP III NITRIDE SUBSTRATE USING A CHEMICAL LIFT-OFF PROCESS

TECHNICAL FIELD

The present invention relates to a method of manufacturing a Group III nitride substrate. More particularly, the present invention relates to a method of manufacturing a non-polar or semi-polar Group III nitride substrate using a chemical lift off (CLO) process.

BACKGROUND ART

Widely spotlighted as a semiconductor light emitting device, LEDs (Light Emitting Diodes) are applied to backlight light sources, display light sources, general light sources, full-color displays, etc., by virtue of properties of compound semiconductors. Typical LED materials are known to be Group III-V nitride semiconductors such as GaN (Gallium Nitride), AlN (Aluminum Nitride), InN (Indium Nitride), etc., and have direct transition type large energy band gaps and thus possess properties adapted for photoelectronic devices, including an ability to obtain almost the entire wavelength of light depending on the composition of nitride. Light emitting devices using such materials are applied in a variety of fields including flat panel displays, optical communication, etc.

Such devices are manufactured in the form of a thin film on a substrate using a growth process such as molecular beam epitaxy (MBE), MOCVD (MetalOrganic Chemical Vapor Deposition), HVPE (Hydride Vapor Phase Epitaxy), etc.

However, semiconductors based on Group III nitrides typically exemplified by GaN are configured such that a device structure is manufactured on a (0001) plane using a c-plane substrate (e.g. a sapphire substrate). In this case, spontaneous polarization is formed in the growth orientation (0001). Particularly in the case of LED having a quantum well structure of InGaN/GaN, when a structure is grown on the (0001) plane, internal strain is caused by lattice mismatch in the quantum well structure, and thus a quantum-confined Stark effect (QCSE) is created due to piezoelectric fields. Hence, limitations are imposed on increasing internal quantum efficiency.

Specifically, Group III nitrides, especially GaN and its alloys (e.g. alloys with InN and/or AlN), are the most stable in a hexagonal wurtzite structure, wherein the crystal structure is configured such that crystals are rotated at 120° with respect to each other, and is represented by two or three equivalent basal plane axes perpendicular to the c-axis.

Any plane perpendicular to the c-axis contains only one type of atom due to the positions of the Group III element and the nitrogen atom in the wurtzite crystal structure. Respective planes may contain one type of atom (Group III element or nitrogen) toward the c-axis. As such, in order to maintain the neutral charge, for example, GaN crystals are configured such that an N-face containing only nitrogen atoms and a Ga-face containing only Ga atoms are positioned at the ends thereof. Consequently, Group III nitride crystals show polarity along the c-axis. Such spontaneous polarization is a bulk property and depends on the structure and composition of crystals. Because of the above properties, most of GaN-based devices are mainly grown in a direction parallel to the polar c-axis. Furthermore, when a heterojunction structure is formed, stress is generated due to a large difference in lattice constant between the Group III nitrides and the same c-axis orientation, and thus piezoelectric polarization is also caused.

In the c-plane quantum well structure in the Group III nitride-based photoelectronic and electronic devices, an electrostatic field caused by piezoelectric polarization and spontaneous polarization may change the energy band structure of the quantum well structure and thus electron-hole distribution may become distorted. The spatial separation of electrons and holes due to such an electric field refers to a quantum-confined Stark effect, which decreases internal quantum efficiency and causes red shift of the light emission spectrum.

To solve the above problems, for example, methods of growing a non-polar or semi-polar Group III nitride are being proposed. The resulting non-polar or semi-polar plane contains the same number of Group III atoms and nitrogen atoms and shows the neutral charge, and no crystals polarize in the growth orientation. However, non-polar Group III nitride crystals growing on the heterogeneous substrate show high defect density, undesirably lowering quantum efficiency.

Meanwhile, in order to achieve homoepitaxial properties, many attempts are being made to manufacture Group III nitride substrates, wherein a thick Group III nitride layer is grown on a heterogeneous substrate such as a sapphire substrate, and the grown Group III nitride layer is then separated from the heterogeneous substrate using a laser lift off (LLO) process and thus used as a substrate.

The reason why the LLO process is used is that a typical nitride layer grown in the c-axis orientation shows Ga-polarity at the surface thereof, making it difficult to actually perform wet etching. However, because the LLO process incurs high costs and is complicated, the use of a chemical lift off process is more preferable.

Furthermore, even when a Group III nitride layer for a non-polar or semi-polar substrate is formed, it is not easy to separate it using a chemical lift off process. This is because the Group III nitride layer useful as a substrate may be damaged in a chemical etching process. Moreover, this problem may be further exacerbated in the course of separating a substrate having a diameter of at least 2 inches adapted for commercialization.

Thus, there is a need for techniques for manufacturing a non-polar or semi-polar Group III nitride substrate, especially a semi-polar Group III nitride substrate, which may solve problems due to polarity with the use of a chemical lift off process.

DISCLOSURE

Technical Problem

Accordingly, the present invention has been made keeping in mind the above problems occurring in the related art due to the use of polar nitrides, and an object of the present invention is to provide a method of manufacturing a non-polar or semi-polar Group III nitride substrate having high quality with low defects.

In particular, the present invention is intended to provide a method of manufacturing a non-polar or semi-polar Group III nitride substrate using a chemical lift off process.

Technical Solution

A first aspect of the present invention provides a method of manufacturing a Group III nitride substrate, comprising a) forming a first Group III nitride layer on a substrate which provides a surface for growing a non-polar or semi-polar epitaxial layer; b) forming a second Group III nitride layer having one or more cavities provided therein on the first Group III nitride layer using lateral growth; c) forming a third Group III nitride layer on the second Group III nitride layer; and d) subjecting at least a partial thickness of the second Group III nitride layer to chemical etching, thus obtaining the separated third Group III nitride layer, wherein at least one region of an inner surface of the cavities is N-polar.

A second aspect of the present invention provides a method of manufacturing a Group III nitride substrate, comprising a) performing anisotropic etching on a silicon (Si) substrate so as to provide a surface for growing a non-polar or semi-polar epitaxial layer; b) growing a Group III nitride layer while forming one or more cavities on the etched Si substrate; c) forming a Group III nitride layer on the Group III nitride layer grown in b); and d) subjecting at least a partial thickness of the Group III nitride layer grown in b) to chemical etching, thus separating the Group III nitride layer formed in c), wherein the surface for growing the non-polar or semi-polar epitaxial layer has (111) facets, and at least one region of an inner surface of the cavities is N-polar.

A third aspect of the present invention provides a substrate manufactured using any one method of the above two methods, and an electronic (or photoelectronic) device including the same. As such, examples of the electronic device may include a light emitting diode (LED), a laser diode (LD), a transistor, etc.

Advantageous Effects

According to embodiments of the present invention, a Group III nitride substrate is a non-polar or semi-polar substrate, can mitigate technical limitations of polar nitrides, and can be advantageously manufactured using a chemical lift off process.

DESCRIPTION OF THE REFERENCE NUMERALS IN THE DRAWINGS

Figure 1A:
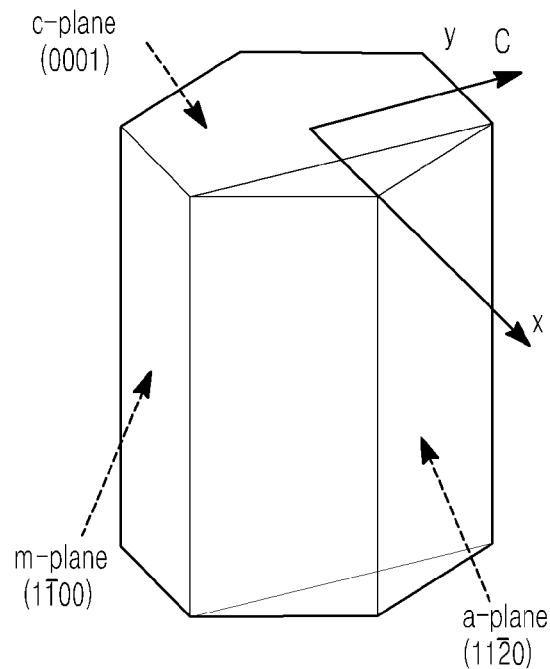
FIG. 1(a) illustrates non-polar planes (a-plane and m-plane) in a GaN crystal structure.

101: substrate
102: first Group III nitride layer
103: insulating layer for mask
103': mask pattern layer
104: second Group III nitride layer
105, 115: cavity
106: third Group III nitride layer
111: (111) facet-formed silicon substrate
114, 116: Group III nitride layer
200: LED
210: non-polar or semi-polar Group III nitride substrate
202: n-type (or p-type) semiconductor layer
203: active layer
204: p-type (or n-type) semiconductor layer
205: p-electrode
206: n-electrode

BEST MODE

The present invention may be fully achieved through the following description. The following description is to be understood to construe preferred embodiments of the present invention, and the present invention is not necessarily limited thereto.

Further, for the sake of description, the appended drawings are exaggeratingly depicted relative to the thicknesses (or heights) of actual layers or ratios with other layers, which may be appropriately understood in accordance with the specific intention of the related description which will be described later.

Furthermore, throughout the description, the terms "on" and "over" are used to refer to the relative positioning, and mean not only that one component or layer is directly disposed on another component or layer but also that one component or layer is indirectly disposed on another component or layer with a further component or layer being interposed therebetween. Also, spatially relative terms, such as "below", "beneath", "lower", and "between", may be used herein for ease of description to refer to the relative positioning.

As used herein, the term "Group III nitride" means a semiconductor compound formed by a Group III element on the periodic table and nitrogen. Examples of the Group III element may include aluminum (Al), gallium (Ga), indium (In), etc., which may be used alone or in combination of two or more, and thus may be understood as the concept of including GaN, AlN, InN, AlGaN, AlInN, GaInN, AlInGaN, etc. When this compound is generalized, the Group III nitride may be illustratively represented by General Formula 1 below.

 [General Formula 1]

wherein 0≤x≤1, 0≤y≤1, and 0≤x+y≤1.

As used herein, the term "lateral growth" or "lateral overgrowth" means the concept of including lateral epitaxial overgrowth (LEO, ELO or ELOG), PENDEO epitaxy, etc., and facilitates lateral growth rather than vertical growth to thus suppress propagation of defects or dislocation in a direction perpendicular to the surface of a layer. This process is used to reduce defects or dislocation upon c-plane GaN growth using MOCVD, etc., as known in the art.

The term "non-polar" is a meaning having a crystal orientation (e.g. a-plane and m-plane) perpendicular to the c-axis, and the non-polar plane of the Group III nitride crystal structure may be illustrated as in FIG. 1(a).

Figure 1B:
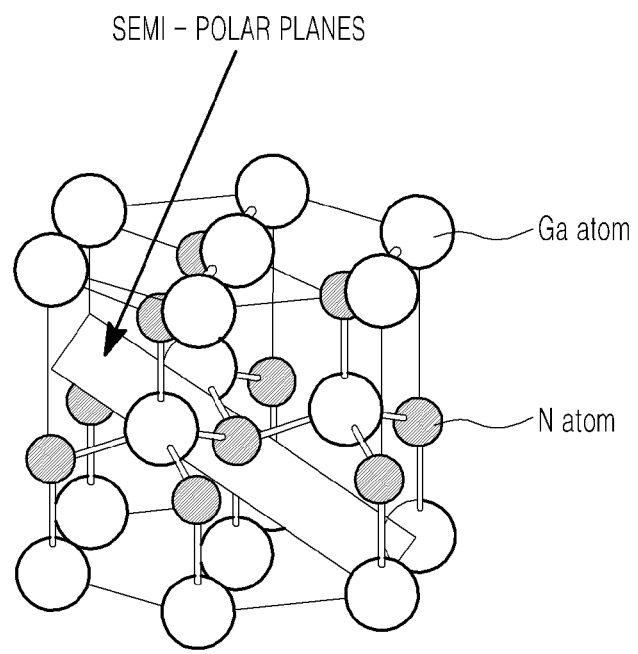
FIG. 1(b) illustrates semi-polar planes in the GaN crystal structure.

The term "semi-polar" is a meaning having a crystal orientation of 0 to 90° with respect to (0001) or (000-1). As such, the semi-polar plane extends diagonally across the hexagonal unit cell and forms an angle other than 90° to the c-axis. Particularly when comparing with the polar (0001) layer, a polar vector is inclined relative to the growth orientation, thus reducing polar effects. Examples of the semi-polar plane typically observed in the Group III nitride may include (11-22), (1-101), (10-11), (10-13), (10-12), (20-21), (10-14), etc., but the present invention is not limited to the above specific values. The semi-polar plane may be illustrated as in FIG. 1(b), and for example, (11-22) oriented semi-polar GaN is present at an angle of about 58° relative to the (0002) plane.

Figure 2:
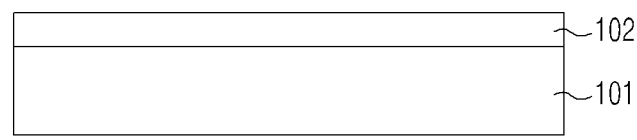
FIG. 2 is a cross-sectional view illustrating a first Group III nitride layer (a template) formed on a substrate, according to an embodiment of the present invention.

FIG. 2 illustrates a first Group III nitride layer (a template) formed on a substrate according to an embodiment of the present invention.

In the above embodiment, first, second and third Group III nitrides may indicate a non-polar or semi-polar layer, preferably a semi-polar layer.

As seen in the above drawing, a first Group III nitride epitaxial layer 102 is grown on a substrate 101. As the substrate 101, any substrate may be used without limitation so long as it is adapted for growth of the non-polar or semi-polar Group III nitride layer. Such a substrate may include a symmetry-equivalent plane, such as a-plane, r-plane or m-plane.

Also, in order to form a non-polar Group III nitride layer, an r-plane substrate is preferably used, and a semi-polar m-plane substrate (e.g. (1-100) plane orientation) is preferably used to form a Group III nitride layer.

In this regard, examples of the material for the substrate may include sapphire, silicon carbide (SiC), lithium aluminate, spinel, etc. In some cases, a Group III nitride or its alloy material (e.g. gallium nitride (GaN), aluminum nitride (AlN), etc.) may be used.

According to an exemplary embodiment, in order to form a semi-polar substrate, an m-plane sapphire substrate is preferably used. Prior to forming the nitride layer on the substrate 101, removal of residual oxygen from the reactive region, or annealing or hat treatment of the reactive region using hydrogen and/or nitrogen (at high temperature, for example, up to a growth temperature) may be selectively performed. Also, for example, in the case of a sapphire substrate, the surface of the substrate may be subjected to nitridation using anhydrous ammonia.

In a modification of the embodiment of the present invention, an intermediate layer or a buffer layer (not shown) may be formed before growth of the first Group III nitride layer 102 on the substrate 101. Such an intermediate layer may be optionally formed to obtain good properties of the Group III nitride layer 102, and examples of the material therefor include not only Group III-V compounds such as AlN, AlGaN, etc., but also other materials adapted for promoting the growth of a non-polar Group III nitride layer, especially a semi-polar Group III nitride layer. As such, deposition or epitaxial growth techniques known in the art, such as MOCVD, HVPE, etc, may be utilized.

The dimension of the intermediate layer optically formed is not particularly limited, but may be at least about 10~50 nm. Furthermore, to form the intermediate layer, for example, process conditions may be controlled to about 550~750° C. under atmospheric pressure, which is to be understood illustratively and in which the present invention is not limited to the above numerical ranges.

In the embodiment, a typical epitaxial growth process, for example, MOCVD, HVPE, MBE, etc., may be adopted to form the non-polar or semi-polar Group III nitride layer on the substrate (or the intermediate layer on the substrate). For instance, MOCVD is preferably used to ensure a template having high quality.

In a specific embodiment of the present invention, the first Group III nitride layer 102 may be formed to a thickness of about 1~10 μm, and preferably about 2~5 μm. To form the first Group III nitride layer 102, a growth reaction may be carried out under conditions of, for example, about 800~1100° C. and about 200~500 torr for about 60~300 min. The growth conditions mentioned above are merely illustrative, and may vary depending on the size of the substrate, etc., and the present invention is not necessarily limited thereto.

Also, in the present embodiment, the first Group III nitride layer 102 preferably has semi-polar orientation properties, and particularly, substrate properties and growth conditions may be adjusted so as to ensure a (11-22) orientation.

Figure 3:
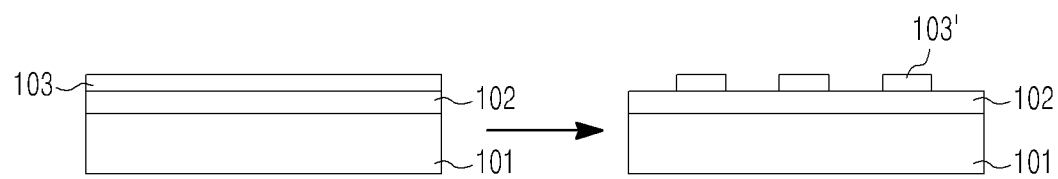
FIG. 3 is of cross-sectional views illustrating the formation of a mask pattern (a stripe pattern) on the first Group III nitride layer, according to the embodiment of the present invention.
Figure 4:
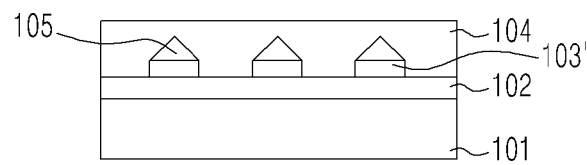
FIG. 4 is a cross-sectional view illustrating a second Group III nitride layer regrown on the first Group III nitride layer using lateral growth (or overgrowth), according to the embodiment of the present invention.

FIGS. 3 and 4 illustrate a process of forming tunnels by continuously forming cavities 105 along a lower mask having a specific pattern (a stripe pattern in the drawings) in the second Group III nitride layer 104 regrown via the lateral growth or lateral overgrowth on the first Group III nitride layer 102.

As seen in the drawings, the lateral growth process may be performed under, for example, ammonothermal growth conditions. Among the above-mentioned various lateral growth processes, ELOG may be adopted. As such, a typical growth process, for example, MOCVD, HVPE, etc., may be used, and MOCVD is preferably utilized to facilitate the formation of cavities, as will be described later. This is because it is easy to perform growth in an inverted trapezoid shape in the lateral growth process to thus form cavities, in particular, triangular cavities.

The ELOG process is a modification of a selective crystal growth process, and is used to prevent vertical propagation of the dislocation at an initial growth step by partially patterning a thin-film insulating layer on the grown Group III nitride layer. Below, the ELOG process is described.

With reference to the above drawings, a mask layer 103' in a stripe pattern is formed on the first semi-polar Group III nitride layer 102. As such, a mask in a stripe pattern is typically formed of a dielectric material, which is exemplified by $SiO_2$, $SiN_x$ (e.g. $Si_3N_4$), etc.

In order to form the mask pattern, an insulating layer 103 is formed using, for example, PECVD (Plasma Enhanced Chemical Vapor Deposition). Subsequently, a set of parallel stripes 103' are left behind as the mask pattern on the first Group III nitride layer 102 using photolithography (wherein, for example, a typical process ICP-RIE may be adopted for etching). As such, the region between the stripes of the mask pattern may refer to a "window region."

The width of the mask may be, for example, about 2~50 μm (preferably about 2~10 μm), and the width of the window may be about 2~20 μm (preferably about 2~10 μm).

Also, the thickness of the mask may be appropriately set to about 500~2,000 Å. In the present embodiment, the mask may have a pattern even in any orientation which may be placed on the planes, and preferably in a (1-100) orientation. The reason why the orientation of the mask pattern is taken into consideration is that it affects the formation of the facets of the (over)grown Group III nitride layer, etc.

Typically, in the case of a Group III nitride, especially GaN, the growth rate of the c-plane orientation is much higher, compared to the other planes. In the case where the growth becomes uniform by decreasing the growth rate of the c-plane orientation using the mask (made up of e.g. $SiO_2$) pattern, the quality of the entire growth layer may be improved and the flat and smooth surface may be obtained. In particular, when the mask pattern is oriented in (1-100), a smoother surface may be obtained. However, when the mask pattern is oriented in (-1-123), a surface having a micro-sized roughness may be formed. Thus, although the present embodiment is not necessarily limited to the mask pattern in a specific orientation, the mask pattern is preferably oriented in (1-100).

Subsequently, regrowth of the Group III nitride is carried out, wherein such regrowth starts from the window region. In this case, a microstructure of the lower first Group III nitride layer 102 is reproduced, whereas growth does not occur on the mask region. Crystals growing in the window region undergo lateral growth (overgrowth) toward the upper surface of the mask with time. Like this, the growth layer of the Group III nitride extends vertically and laterally. As such, a region grown laterally is referred to as a "wing region," in which high-quality crystals whose defects are considerably decreased may be obtained.

The vertical and lateral (horizontal) extension ratio depends on the growth conditions. With the lapse of time, the nitride overgrowth layer extended laterally (e.g. to a right direction) from the window may be combined with the nitride overgrowth layer extended laterally (e.g. to a left direction) from the adjacent window. Ultimately, cavities 105 are formed under the combined boundaries, and the cavities may be continuously formed along the mask pattern, thus forming a tunnel structure. The cavities 105 may have a variety of shapes, such as triangular, square, rectangular, or circular shapes, depending on the process conditions, etc. Particularly preferable is a triangular shape as illustrated in the drawing.

Although the cavities are continuously connected to form tunnels, as illustrated in the above embodiment, they may be intentionally or unintentionally disconnected in some zones, which may also be incorporated in the scope of the present invention.

In this embodiment, cavities are continuously connected in the second Group III nitride layer to form tunnels. To this end, a semi-polar Group III nitride may be properly used, but the present invention is not limited thereto. A non-polar Group III nitride may be used so long as the cavities are formed via suitable process conditions.

The thickness of the second Group III nitride layer 104 may be, for example, about 3~10 μm, and the size (diameter or height) of the cavities may be about 2~50 μm, and preferably about 2~10 μm. Such numerical ranges are merely illustrative, and may vary depending on the process conditions.

For example, the size of triangular cavities may vary depending on the size of a pattern mask. When the width of the mask is about 7 μm, the diameter of the triangular cavities may be about 6 μm. If the width of the mask increases, the diameter of the triangular cavities may proportionally increase, and the growth time may also increase in proportion to an increase in the width of the mask.

In the exemplary embodiment, the second Group III nitride layer 104 may be formed (grown) via combination of a variety of parameters. For example, the growth temperature may be about 700~1,100° C. (more preferably about 800~1,000° C.), and the pressure may range from about 200 to 400 mTorr. For example, in the case where the mask pattern is oriented in (1-100), the process may be carried out at about 800~1100° C. for about 240~600 min. As such, the flow rate of supplied Ga source (e.g. trimethylgallium, triethylgallium, etc.) may fall in the range of about 10~30 sccm.

While the second Group III nitride layer 104 gradually grows in an inverted trapezoid shape from the window, triangular cavities 105 are formed.

The lateral growth layer thus obtained may show its properties via X-ray diffraction (XRD) analysis. Typically, non-polar and semi-polar layers show anisotropy depending on the angle (orientation angle). In this regard, in the case of the semi-polar Group III nitride which may be obtained via lateral growth in the present embodiment, for example, about 300~500 arcsec (FWHM is represented by arcsec (degree× 3600)) is preferably shown.

Figure 5:
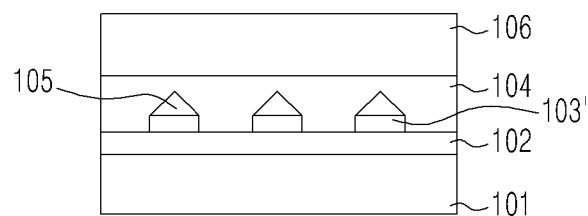
FIG. 5 is a cross-sectional view illustrating a third Group III nitride layer formed on the second Group III nitride layer, according to the embodiment of the present invention.

FIG. 5 is a cross-sectional view illustrating a third Group III nitride layer 106 formed on the second Group III nitride layer 104 according to the embodiment of the invention.

The third Group III nitride layer 106 is separated from the lower substrate using a subsequent lift off process, and may thus be used as a substrate (e.g. a substrate for homoepitaxial growth) to manufacture electronic (or photoelectronic) devices such as LEDs, LDs, transistors, etc.

As such, a typical growth process known in the art may be applied, and MOCVD or MBE is favorable in terms of growing a high-quality epitaxial layer, but is disadvantageous because of high cost and low growth rate. However, HVPE is favorable in terms of low growth cost and high growth rate, and is thus adapted to form a thick growth layer. The present embodiment is not limited to a specific growth process, but the use of HVPE is preferable considering the foregoing. HVPE may be carried out as follows.

Typically, Ga is placed in a horizontal reactor having a two-stage temperature gradient in the temperature range of about 700~900° C., and the preformed target (which is configured such that first and second Group III nitride layers are formed on a substrate) is positioned in the growth region (e.g. about 900~1100° C.). Then, GaCl synthesized by reacting Ga with HCl gas in a quartz container is fed to the target together with a carrier gas, and an ammonia gas is fed to the region where the target is positioned by passing through an additional quartz plate. Accordingly, the Group III nitride is grown on the target via the reaction of $GaCl+NH_3 \rightarrow GaN+ HCl+H_2$ (upon growing GaN).

As such, the third Group III nitride layer 106 may have a thickness of at least about 200 μm, and preferably about 300~500 μm so as to be adapted for a substrate for growth. The third Group III nitride layer 106 may exhibit the same crystal properties, that is, semi-polar or non-polar properties, as those of the lower semi-polar or non-polar second Group III nitride layer corresponding to the template.

Figure 6:
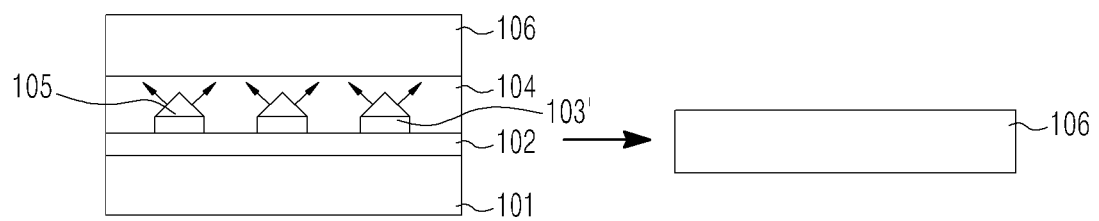
FIG. 6 is of cross-sectional views schematically illustrating chemical etching of the second Group III nitride layer disposed at the lower position to separate the third Group III nitride layer (for use in a substrate), according to the embodiment of the present invention.

After formation of the third Group III nitride layer 106 that is subsequently useful as a substrate, chemical etching may be conducted to remove at least a partial thickness of the lower second Group III nitride layer. In this regard, FIG. 6 illustrates a schematic process of performing chemical etching of the second Group III nitride layer 104 to separate the third Group III nitride layer usable as an independent substrate, according to the embodiment of the present invention. As illustrated in this drawing, etching is performed in a direction parallel or perpendicular/parallel to the cavities in a tunnel form.

The reason why chemical etching is possible in the above embodiment may be described as follows, but the present invention is not limited thereto.

As a typical Group III nitride, GaN crystals have two different faces, that is, Ga-face and N-face. As such, the end of the Ga-face terminates with a gallium atom, whereas the end of the N-face terminates with a nitrogen atom. The Ga-face is chemically stable, but the N-face is chemically unstable and is very reactive (chemically active).

Typically, in the case of a polar nitride layer ((0001) plane) grown on a c-plane substrate, because the end of the surface is the Ga-face, it is remarkably chemically stable, making it difficult to perform chemical etching. However, in the case of a target to be etched, in particular, a second Group III nitride layer 104, the N-polar face is present at the inner surface of the cavities (e.g. at least one region of the inner surface of the cavities). Specifically, -c plane, and (n- or r-) plane are present at both faces of a triangular cavity, but the bottom of the cavity is formed with $SiO_2$. In the illustrated embodiment, the N-polar -c plane and the (n- or r-) plane that is partially N-polar are present at the upper two faces except for the bottom of the tunnel.

Generally, when chemical etching may be conducted on an N-polar face, not only is the N-polar face etched, but also a single GaN particle is etched because binding energy of Ga and N in the single GaN particle is larger. Thus, when the N-polar face is exposed, etching starts from the exposed face and may be carried out on the whole.

As mentioned above, chemical etching may be carried out simultaneously on the inner surface of the tunnels and on the surface of the first and second Group III nitride layers having non-polar or semi-polar properties.

At least a partial thickness of the first and second Group III nitride layers, especially, the second Group III nitride layer, may be removed, thereby separating the third Group III nitride layer from the lower structure.

According to the present embodiment, the third Group III nitride layer having a large area (e.g. at least 2 inches) may be effectively separated. As mentioned above, even when the non-polar or semi-polar Group III nitride is subjected to chemical (wet) etching, if the cavity tunnels across the second Group III nitride layer are not formed, partial etching of the outer surface of the third Group III nitride layer may occur unavoidably in the course of etching. However, in the above embodiment, because the cavity tunnels are present at intervals of ones of to tens of μm, only the intervals between the cavity tunnels are etched, thereby separating the third Group III nitride layer.

In order to perform a chemical lift off process, a variety of wet etching processes may be used. As such, when the separation of the third Group III nitride 106 is performed as soon as possible using a strong acid (e.g. $H_3PO_4$) or a heated (molten) strong base (e.g. an alkaline salt such as NaOH, KOH, etc., or mixtures thereof), damage due to etching may be maximally suppressed. In the case of using a molten alkaline salt, etching conditions may be set such that etching is performed in the temperature range of at least about 300° C., and more preferably about 400~600° C. for about 0.5~20 min. The present invention is not necessarily limited to the above conditions, and such conditions may vary depending on the crystal properties in the target to be etched, the diameter of the cavity relative to the size of the pattern mask, etc. For example, as the diameter of the cavities increases, the etching rate may become higher.

In another embodiment of the invention, a method of manufacturing a non-polar or semi-polar Group III nitride substrate using a silicon (Si) substrate is provided.

Figure 7:
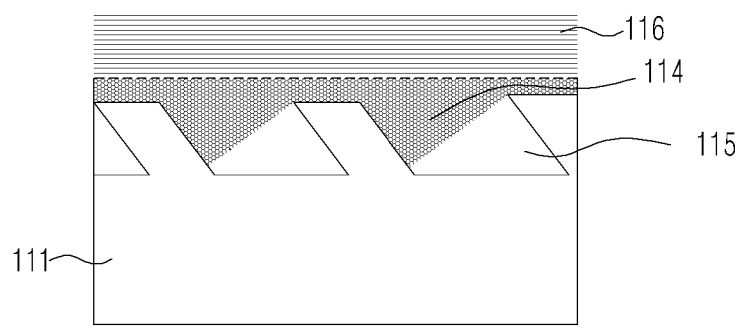
FIG. 7 is a cross-sectional view schematically illustrating a thick non-polar or semi-polar Group III nitride layer formed on a template comprising a non-polar or semi-polar Group III nitride layer having cavities formed on a silicon substrate, according to another embodiment of the present invention.

FIG. 7 is a cross-sectional view schematically illustrating a thick non-polar or semi-polar Group III nitride layer (e.g. having a thickness of at least about 200 μm) formed on a template comprising a non-polar or semi-polar Group III nitride layer with cavities formed on a Si substrate, according to another embodiment of the invention.

In this embodiment, the Si substrate 111 has, for example, (111) facets formed thereon. As such, the Si substrate may be a (311) or (001) Si substrate. As shown in this drawing, to form the (111) facets, patterning, particularly, patterning using anisotropic etching, may be performed. Because of the (111) facets formed on the Si substrate, a Group III nitride may be selectively grown (formed) (i.e. selective growth). That is, the Group III nitride layer 114 may be grown (formed) while forming, for example, triangular cavities 115, by virtue of the (111) facets formed on the Si substrate.

In this embodiment, the Group III nitride layer 114 grown while forming the cavities 115 may be semi-polar (e.g. (1-101) or (11-22)) or non-polar (e.g. (11-20)). Thus, the Group III nitride layer 114 functions as the template, and the Group III nitride layer 116 formed thereon may also exhibit semi-polar or non-polar properties.

The Group III nitride layer 116 is formed (grown) to a thickness of, for example, at least about 200 μm, and is then separated from the lower Group III nitride layer 114 having the cavities via chemical etching as mentioned above, and is thereby used as a freestanding Group III nitride substrate.

Meanwhile, in the present embodiment, a pattern mask layer (e.g. a $SiO_2$ mask) may be used.

In an exemplary embodiment, a $SiO_2$ mask (e.g. a thickness of about 70 nm, a mask width of about 1 μm or less, and a pattern interval of about 1 to 3 μm) is formed on a (311) Si substrate using photolithography, thus forming a pattern (e.g. a stripe pattern) on the Si substrate, which is then etched at about 30 to 50° C. using an etching solution (e.g. a KOH solution), followed by removing the mask layer using HF (e.g. diluted HF), a buffered oxide etchant (HF+$NH_4F$ mixture; BOE), etc. Thereby, (111) facets are formed on the Si substrate via the above etching treatment.

Subsequently, a Group III nitride layer 114 is formed to a predetermined thickness on the Si substrate via (re)growth using MOCVD, etc. In the growth process, the intermediate layer or buffer layer (not shown) mentioned above may be optionally formed.

The growth of the Group III nitride may be performed at, for example, about 900~1,100° C. The growth of the thick Group III nitride layer 116 which is subsequently formed, and the principle and description of chemical etching are mentioned as above, and a description thereof is omitted.

The Group III nitride substrate manufactured according to the above embodiment may suppress mismatch due to heteroepitaxy caused by using a heterogeneous substrate (made up of, for example, sapphire) which is currently widely available, and thus may be applied to a substrate of an electronic (or photoelectronic) device via homoepitaxial growth. An example of the electronic device may include an LED (Light Emitting Diode), an LD (Laser Diode), a transistor (e.g. HEMT), etc.

Figure 8:
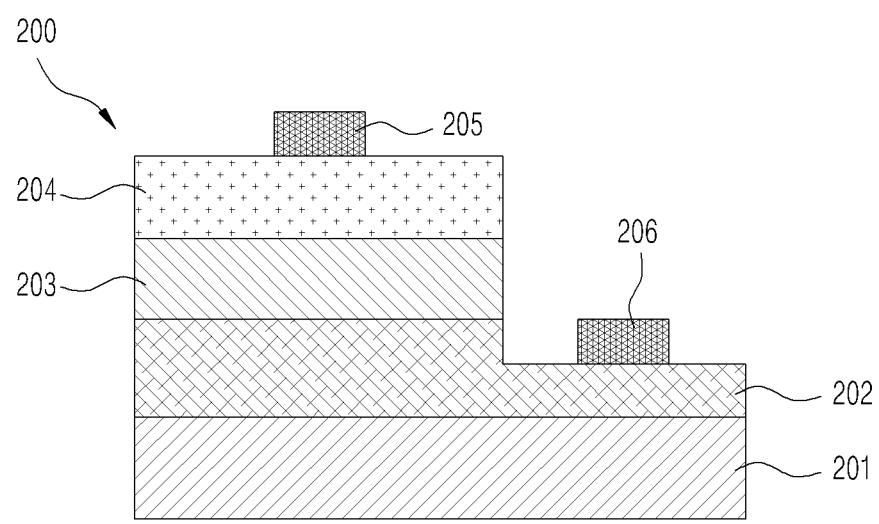
FIG. 8 is a view illustrating the use of the separated third Group III nitride layer according to the embodiment of the present invention, as a substrate for LED.

FIG. 8 illustrates the separated third Group III nitride layer 106, 116, which is applied to a substrate for LED.

As illustrated in this drawing, the LED includes a Group III nitride substrate 201, an n-type (or p-type) semiconductor layer 202, an active layer 203, and a p-type (or n-type) semiconductor layer 204, which are sequentially layered upwards. Formed on the p-type semiconductor layer 204 is a p-electrode 205, and formed on the exposed surface of the n-type semiconductor layer 202 is an n-electrode 206. The layer configuration is merely illustrative, and may be variously modified.

In this regard, the materials for the semiconductor layers 202, 204 and the active layer 203 formed on the substrate 201 are not limited, and examples of semiconductor materials (III-V, II-VI, etc.) useful in manufacturing LEDs in the art may include GaN, InN, AlN, InP, InS, GaAs, CdS, CdSe, CdTe, ZnS, ZnSe, ZnTe, ZnO, $Al_xGa_{1-x}N$, $In_xGa_{1-x}N$, $In_xGa_{1-x}As$, $Zn_xCd_{1-x}S$, etc., which may be used alone or in combination (wherein 0<x<1). To effectively achieve homoepitaxial properties, a Group III nitride may be used.

The active layer 203 may be composed of at least two materials selected from among GaN, AlN, InN, InGaN, AlGaN, and InAlGaN. Among them, a material having a low energy band gap may be used in a quantum well, and a material having a high energy band gap may be used in a quantum barrier, and also, it is possible to provide a single or multiple quantum well structure.

In addition, in the case of the electrodes 205, 206 for electrical application, for example, platinum (Pt), palladium (Pd), aluminum (Al), gold (Au), and nickel/gold (Ni/Au) may be used alone or in combination. To form the electrode pattern, a process known in the art, for example, typical procedures such as photoresist patterning-etching may be performed.

A better understanding of the present invention may be obtained through the following examples which are set forth to illustrate, but are not to be construed as limiting the present invention.

Example 1

Growth of First GaN Layer

A planar semi-polar GaN layer was formed on an m-sapphire substrate (available from Crystal-On: M-plane 2" sapphire wafer, thickness 430 μm) using a MOCVD device (available from Veeco) under the following conditions of Table 1. As such, a gallium source and a nitrogen source were trimethylgallium and ammonia, respectively.

TABLE 1

|  | Temp. (° C.) | Time (min) | Pg (Torr) |
| --- | --- | --- | --- |
| Nitridation | 1080 | 0.75 | 500 |
| Low-temp. Growth (intermediate layer) | 700 | 4 | 200 |
| Recrystallization | 1060 | 5 | 200 |
| High-temp. Growth | 880 | 180 | 300 |

As is apparent from the results of analysis using HR-XRD, the semi-polar GaN layer having a thickness of about 2 μm and an (11-22) orientation was formed.

Growth of Second GaN Layer

ELOG was performed on the first GaN layer using a mask patterned with stripes arranged by a predetermined interval (Sample Nos. 1 and 2). As such, as the mask, a $SiO_2$ layer was deposited to a thickness of 100 nm using PECVD, after which the width (mask region) of the stripes and the interval (window region) of the stripes were respectively adjusted to 7 μm and 4 μm via ICP-RIE etching using standard photolithography. As such, the mask pattern was formed in a (1-100) orientation.

Subsequently, the GaN layer was regrown (ELOG) at 880° C. and 300 mTorr using MOCVD. As such, the thickness of Sample No. 1 was about 2 μm, and the thickness of Sample No. 2 was about 4 μm.

Separately, a second GaN layer was regrown on the first GaN layer under different process conditions, thus obtaining Sample Nos. 3 and 4. Among them, Sample No. 3 was obtained via regrowth without a mask pattern (thickness: about 1.2 μm), and the mask pattern orientation of Sample No. 4 was (-1-123) (thickness: about 2 μm).

The process conditions of Sample Nos. 1 to 4 are shown in Table 2 below.

TABLE 2

| Sample No. | 1 | 2 | 3 | 4 |
| --- | --- | --- | --- | --- |
| Mask pattern orientation | (1-100) | (1-100) | — | (-1-123) |
| Growth time (min) | 180 | 360 | 180 | 180 |
| Gallium source flow rate (sccm) | 20 | 20 | 20 | 20 |

Figure 9:
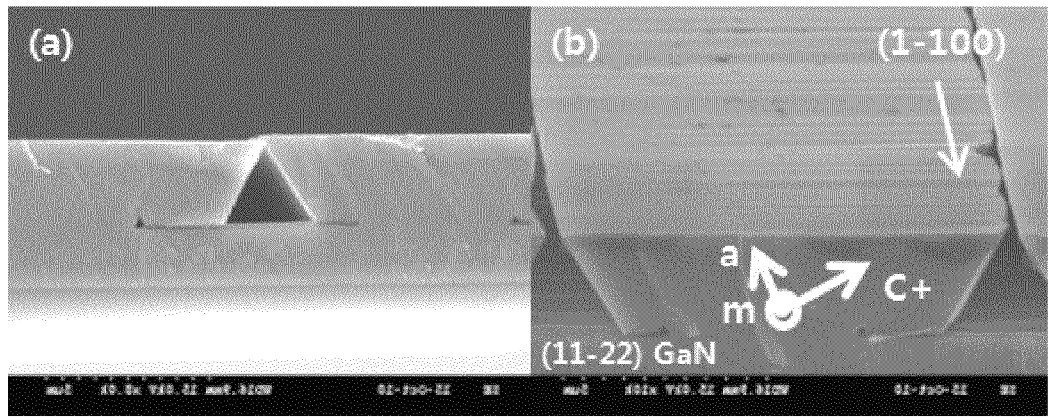
FIG. 9 is of SEM (Scanning Electron Microscope) images illustrating the cross-section of the laterally grown second GaN layer (Sample No. 1), in Example 1 according to the present invention.
Figure 10:
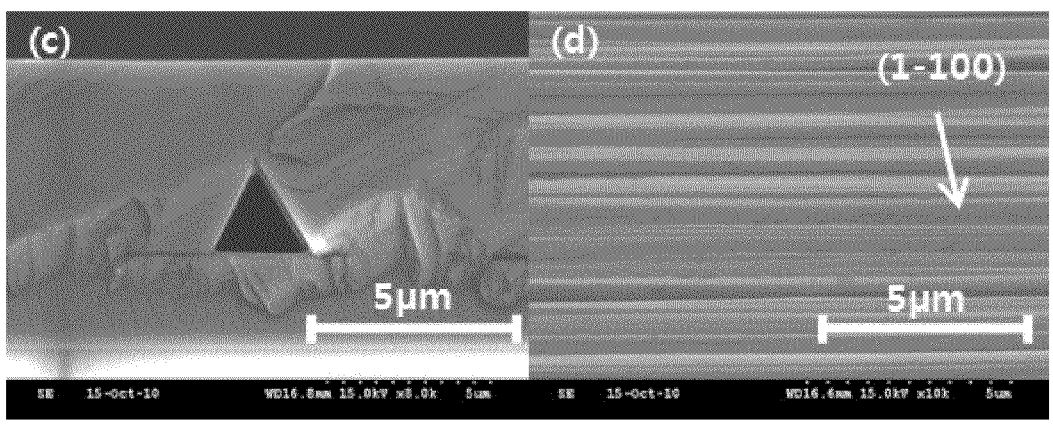
FIG. 10 is of SEM images illustrating the cross-section of the laterally grown second GaN layer (Sample No. 2), in Example 1 according to the present invention.

The SEM images of the cross-section of the laterally grown second GaN layer of Sample Nos. 1 and 2 are illustrated in FIGS. 9 and 10, respectively.

As illustrated in the above drawings, the GaN layer regrown from the window region gradually extended laterally while being overgrown toward the upper surface of the mask region with time. As lateral growth continued, the laterally grown layers extended from both sides on the wing region were combined together, and thus triangular cavities were continuously connected along the mask pattern, thus forming tunnels.

Figure 11:
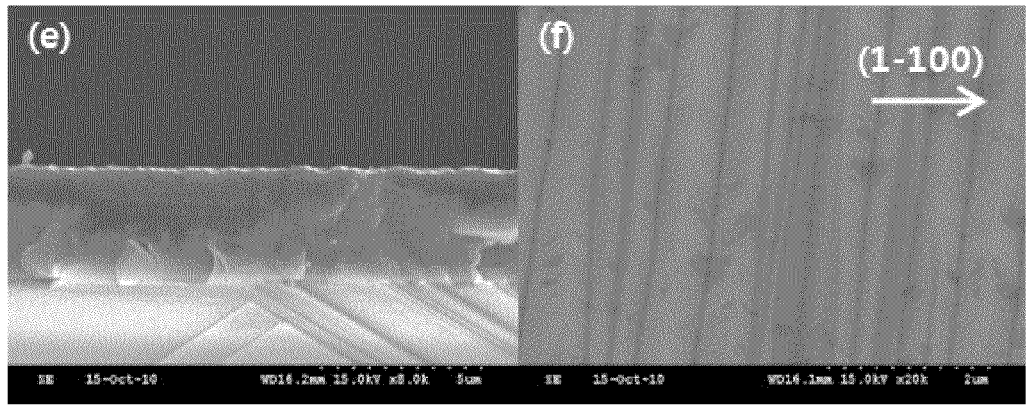
FIG. 11 is of SEM images illustrating the cross-section of the second GaN layer (Sample No. 3) regrown on the first GaN layer without a mask pattern, in Example 1 according to the present invention.
Figure 12:
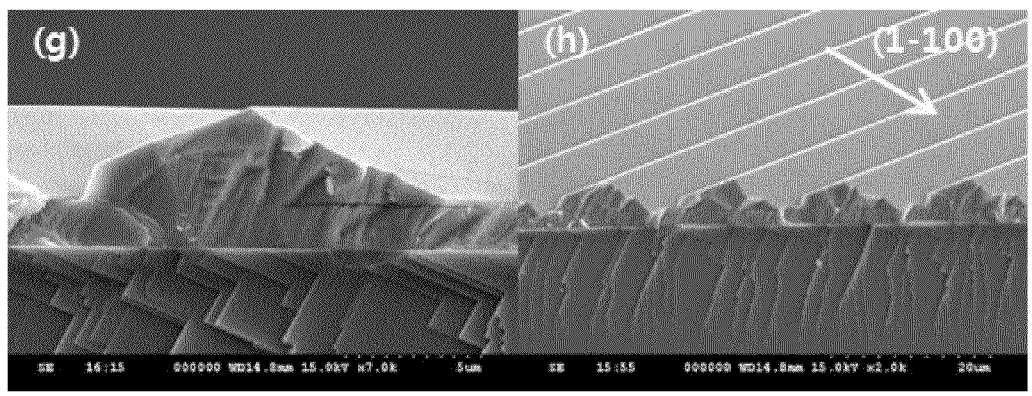
FIG. 12 is of SEM images illustrating the cross-section of the laterally grown second GaN layer (Sample No. 4), in Example 1 according to the present invention.

In the case where regrowth was performed without the mask pattern (Sample No. 3) and the case where regrowth was performed using the mask pattern in a (-1-123) orientation (Sample No. 4), the SEM images of the cross-section of the second GaN layer are illustrated in FIGS. 11 and 12.

In Sample No. 3, as seen in FIG. 11, the planar regrowth layer was formed. Also, in Sample No. 4, the triangular cylinder shaped second GaN layer was formed along the mask pattern on the first GaN layer.

Using an XRD analytical device (available from PANalytical, High-resolution X-Ray diffraction), changes in FWHM (full width at half maximum; unit: arcsec) depending on the azimuthal angle in Sample Nos. 1 to 4 were measured. The FWHM values of Sample Nos. 1 to 4 were 733, 468, 517 and 840 arcsec, respectively. Consequently, Sample No. 2 was superior in semi-polar properties and had lower anisotropy, compared to the other samples.

Growth of Third GaN Layer

A third GaN layer (thickness: 300 μm) was grown on Sample No. 2 having the cavity tunnels using HVPE.

The HVPE process conditions are shown in Table 3 below.

TABLE 3

| Source (Ga) Temp. | 800° C. |
| --- | --- |
| Growth Temp. | 1000° C. |
| Source HCl gas flow rate | 500 sccm |
| Ammonia ($NH_3$) gas flow rate | 1000 sccm |
| $N_2$ carrier gas flow rate | 2000/3500 ($HCl/NH_3$) sccm |

TABLE 3-continued

| | |
|---|---|
| Total flow | 40 slm |
| Growth time | 600 min |
| Holder rotation | 30 RPM |

Figure 13:
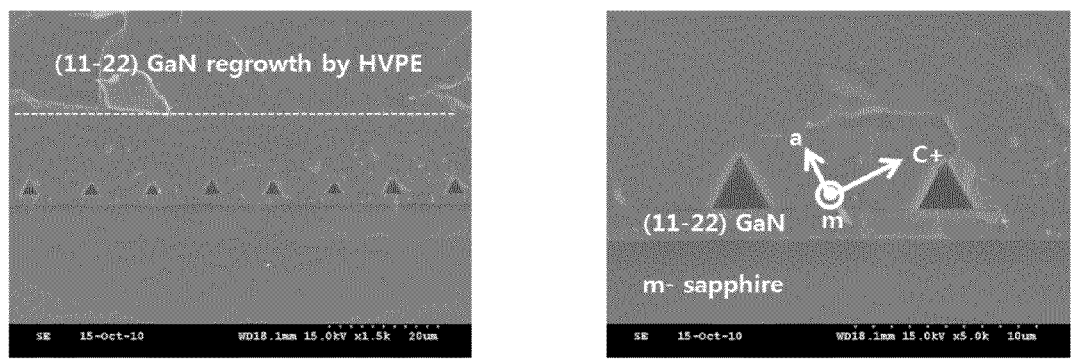
FIG. 13 is of SEM images illustrating the cross-section of the thick third GaN layer formed on Sample No. 2 using HVPE, in Example 1 according to the present invention.

The SEM images of the third GaN layer grown under the above conditions are illustrated in FIG. 13.

As seen in the above drawing, the thick third GaN layer (i.e. (11-22) GaN layer) was formed as in the lower second GaN layer (i.e. (11-22) GaN layer).

Separation of Third GaN Layer

Figure 14A:
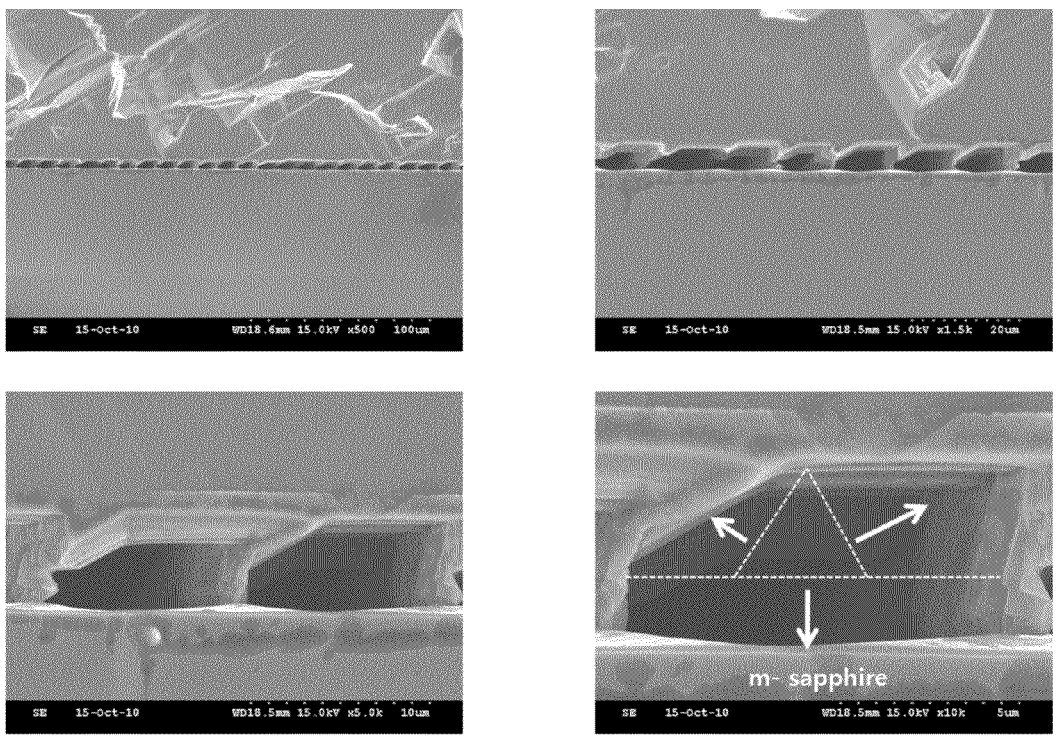
FIGS. 14(a) to 14(c) are SEM images illustrating changes in the second GaN layer depending on the time upon chemical etching for 60 sec while the temperature of molten KOH as an etching solution is maintained at 550° C., in Example 1 according to the present invention.
Figure 14B:
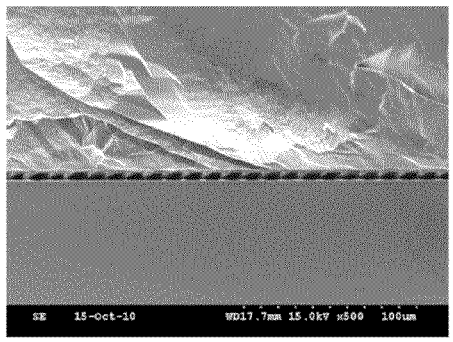
Figure 14B:
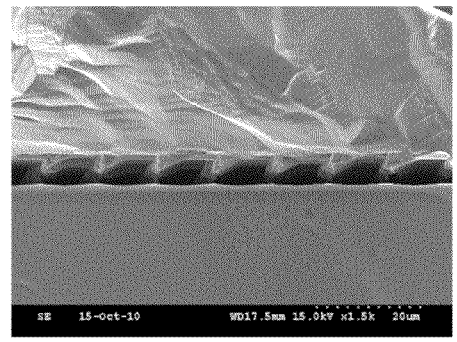
Figure 14B:
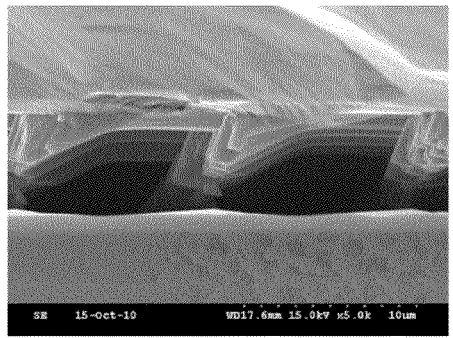
Figure 14B:
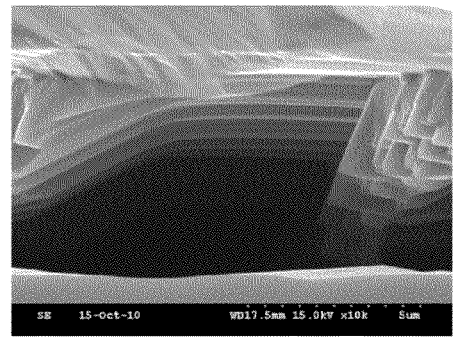
Figure 14C:
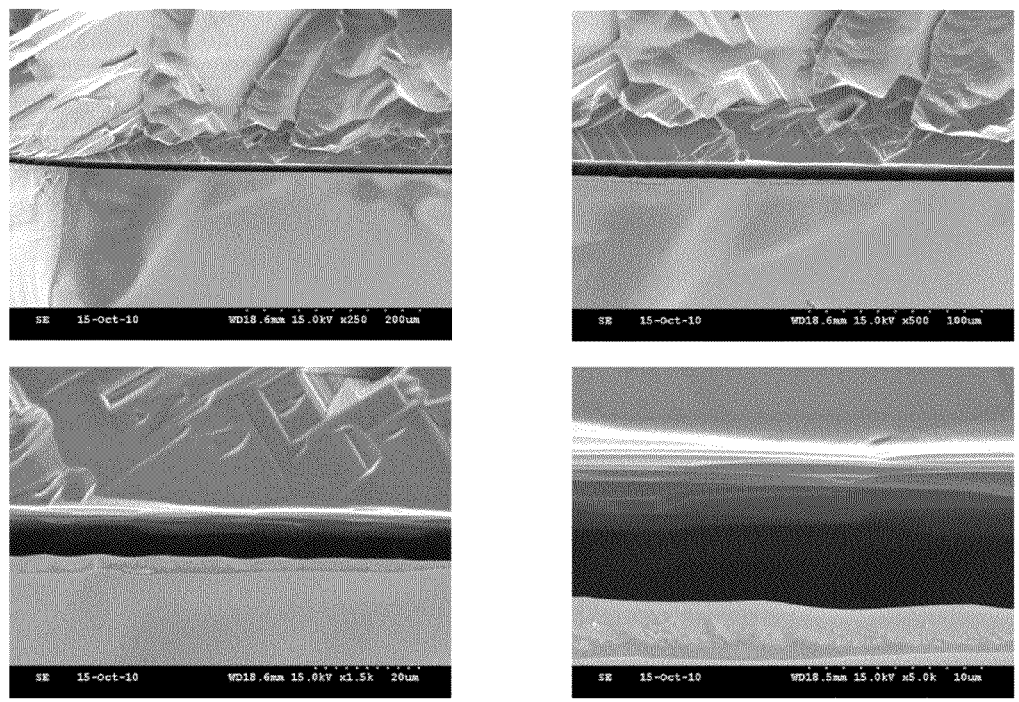

Molten KOH was added to a beaker so that the above obtained structure (the first, second and third GaN layers formed on the substrate) was sufficiently immersed, and the beaker was then placed on a hot plate. The temperature was increased to 550° C. so that KOH was sufficiently melted and thus a liquid phase was maintained, after which the above structure was added. The changes in the second GaN layer via etching were observed from the SEM images. After 20 sec, 40 sec and 60 sec, changes in the second GaN layer are shown in FIGS. 14a to 14c.

As shown in these drawings, etching started from the inner surface of the cavities after 20 sec, and the adjacent cavities were connected to each other as etching progressed after 40 sec. After 60 sec, the second GaN layer was mostly etched, and thereby the lower first GaN layer and the upper third GaN layer were separated from each other.

Example 2

A 70 nm thick $SiO_2$ mask layer was deposited on a (311) substrate using sputtering, and a stripe pattern was formed using photolithography (a mask width of 1 μm and a pattern interval of 2 μm). Subsequently, the Si substrate was etched using a KOH solution (25%) at 40° C. Ultimately, (111) facets were formed on the surface of the Si substrate, and removed using a diluted HF solution.

Subsequently, GaN was grown using trimethylgallium (TMG) and ammonia sources by means of a MOCVD device. As such, the flow rates of TMG and ammonia were 15.0 μmol/min and 0.5 slm, respectively, and the growth temperature was 1,050° C., and the growth time was 60 min. As seen in the SEM images, it was observed that the cavity tunnels were formed while the Group III nitride layer was formed on the Si substrate. In the case where chemical etching was performed following the formation of a thick GaN layer on the Group III nitride layer as in Example 1, a freestanding GaN substrate could be confirmed to be manufactured via separation of the thick GaN layer.

Simple modifications and variations of the present invention may be easily used by those skilled in the art, and such modifications or variations may be incorporated in the scope of the present invention.

What is claimed is:

1. A method of manufacturing a Group III nitride substrate, comprising:

a) forming a first Group III nitride layer on a substrate, the substrate providing a surface for growing a non-polar or semi-polar epitaxial layer;

b) forming a mask layer on the first Group III nitride layer, the mask layer including stripes arranged at a regular interval and being patterned in a (1-100) orientation;

c) forming a second Group III nitride layer on the first Group III nitride layer, wherein the second Group III nitride layer is grown in vertical and lateral directions from the first Group III nitride layer but not grown on the stripes, whereby one or more cavities are formed on the stripes, wherein each of the one or more cavities has a tunnel shape of which a bottom surface corresponds to a whole upper surface of a corresponding one of the stripes, and wherein at least a portion of an inner surface of the cavities includes a N-polar face;

d) forming a third Group III nitride layer on the second Group III nitride layer; and e) performing a chemical etching to separate the third Group III nitride layer from the substrate, wherein the chemical etching is carried out by impregnating the cavities with an etching solution, and the chemical etching starts from the inner surface of the cavities and then etches the first and second Group III nitride layers to connect adjacent cavities each other.

2. The method of claim 1, wherein the substrate which provides the surface for growing the non-polar or semi-polar epitaxial layer is an m-plane sapphire substrate.

3. The method of claim 1, wherein the first Group III nitride layer is a (11-22) oriented semi-polar layer.

4. The method of claim 1, wherein the lateral growth is ELOG (Epitaxial Lateral OverGrowth).

5. The method of claim 1, wherein the mask layer is made up of $SiO_2$ or $SiN_x$.

6. The method of claim 1, wherein
a width of each of the stripes and the regular interval of the stripes are 2~50 μm and 2~20 μm, respectively.

7. The method of claim 1, wherein the third Group III nitride layer is formed using HVPE (Hydride Vapor Phase Epitaxy).

8. The method of claim 1, wherein a thickness of the third Group III nitride layer is at least 200 μm.

9. The method of claim 1, wherein the chemical etching is performed in a molten alkaline salt.

10. The method of claim 9, wherein the chemical etching is performed at 400-600° C. for 0.5-20 min.

11. A Group III nitride substrate, manufactured using the method of claim 1.

12. An electronic device, comprising the Group III nitride substrate of claim 1.

13. A Group III nitride substrate, manufactured using the method of claim 2.

14. A Group III nitride substrate, manufactured using the method of claim 3.

15. An electronic device, comprising the Group III nitride substrate of claim 2.

* * * * *